United States Patent
Itatani et al.

(10) Patent No.: US 7,648,815 B2
(45) Date of Patent: Jan. 19, 2010

(54) NEGATIVE PHOTOSENSITIVE POLYIMIDE COMPOSITION AND METHOD FOR FORMING IMAGE THE SAME

(75) Inventors: Hiroshi Itatani, Yokohama (JP); Shunichi Matsumoto, Kamakura (JP)

(73) Assignee: PI R&D Co., Ltd., Yokohama-shi (JP)

( * ) Notice: Subject to any disclaimer, the term of this patent is extended or adjusted under 35 U.S.C. 154(b) by 391 days.

(21) Appl. No.: 10/380,221

(22) PCT Filed: Sep. 11, 2001

(86) PCT No.: PCT/JP01/07876
§ 371 (c)(1), (2), (4) Date: Jul. 14, 2003

(87) PCT Pub. No.: WO02/23276
PCT Pub. Date: Mar. 21, 2002

(65) Prior Publication Data
US 2004/0041129 A1   Mar. 4, 2004

(30) Foreign Application Priority Data
Sep. 12, 2000   (JP) ............... 2000-318607

(51) Int. Cl.
G03F 7/00 (2006.01)
G03F 7/004 (2006.01)

(52) U.S. Cl. ............... 430/270.1; 430/281.1; 430/913; 430/916

(58) Field of Classification Search .............. 430/270.1, 430/281.1, 913, 916
See application file for complete search history.

(56) References Cited

U.S. PATENT DOCUMENTS

| | | | | |
|---|---|---|---|---|
| 4,558,117 A | * | 12/1985 | Nakano et al. | 528/184 |
| 4,943,682 A | * | 7/1990 | Klobucar et al. | 528/353 |
| 5,310,625 A | * | 5/1994 | Angelopoulos et al. | 430/325 |
| 5,310,933 A | * | 5/1994 | Lupinski et al. | 548/461 |
| 5,502,143 A | * | 3/1996 | Oie et al. | 528/12 |
| 5,532,105 A | * | 7/1996 | Yamadera et al. | 430/156 |
| 5,856,065 A | * | 1/1999 | Hagen | 430/283.1 |
| 6,010,825 A | * | 1/2000 | Hagen et al. | 430/283.1 |
| 6,013,414 A | * | 1/2000 | Gelorme et al. | 430/281.1 |
| 6,232,039 B1 | * | 5/2001 | Chiang et al. | 430/281.1 |
| 6,365,324 B1 | * | 4/2002 | Chiang et al. | 430/281.1 |
| 6,514,658 B2 | * | 2/2003 | Nunomura et al. | 430/191 |
| 6,613,699 B2 | * | 9/2003 | Banba et al. | 438/780 |
| 6,740,466 B1 | * | 5/2004 | Matsumoto et al. | 430/270.1 |
| 6,831,148 B2 | * | 12/2004 | Buchecker et al. | 528/310 |
| 6,943,124 B1 | * | 9/2005 | Lu et al. | 438/781 |
| 7,042,065 B2 | * | 5/2006 | Seto et al. | 257/529 |
| 2005/0119433 A1 | * | 6/2005 | Sakayori | 526/348 |

FOREIGN PATENT DOCUMENTS

| | | |
|---|---|---|
| EP | 1024407 A1 | 8/2000 |
| FR | 2723099 | 2/1996 |
| JP | 5-232701 A | 9/1993 |
| JP | 6-93179 A | 4/1994 |
| JP | 9-71646 A | 3/1997 |
| JP | 9-208696 A | 8/1997 |
| JP | 11-52572 A | 2/1999 |
| JP | 11-282160 A | 10/1999 |

OTHER PUBLICATIONS

English language machine translation of JP 11-52572.*

* cited by examiner

Primary Examiner—Amanda C. Walke
(74) Attorney, Agent, or Firm—Birch, Stewart, Kolasch & Birch, LLP

(57) ABSTRACT

Disclosed is a composition of a negative-type photosensitive polyimide which is solvent soluble, which is excellent in adhesiveness, heat resistance, mechanical properties and in flexibility, which shows characteristics of alkali-soluble highly sensitive negative-type photoresist upon irradiation with light, The composition according to the present invention comprises a photo radical initiator and a solvent-soluble polyimide which shows negative-type photosensitivity in the presence of the photo radical initiator.

16 Claims, No Drawings

NEGATIVE PHOTOSENSITIVE POLYIMIDE COMPOSITION AND METHOD FOR FORMING IMAGE THE SAME

This application is the national phase under 35 U.S.C. § 371 of PCT International Application No. PCT/JP01/07876 which has an International filing date of Sep. 11, 2001, which designated the United States of America.

TECHNICAL FIELD

The present invention relates to a negative-type photosensitive polyimide composition, insulation film made from the same, and method for forming insulation film patterns using the same. Since polyimides have excellent heat resistances, electrical insulation properties, mechanical properties and drug resistances, they are applied to electric and electronic parts, semiconductors and peripheral circuits thereof.

BACKGROUND ART

Photosensitive resin compositions are classified into A) polarity-changing type wherein the polarity of the exposed regions is changed so that the solubility thereof is changed, B) cutting type wherein chemical bonds are cut by exposure and the exposed regions are solubilized, and C) cross-linking type wherein cross-linking reaction proceeds so that exposed regions are insolubilized. The polarity-changing type may be used as either positive-type or negative-type composition depending on the composition of the developing solution. The cutting type may be used as positive-type composition, and the cross-linking type may be used as negative-type composition in theory. The cross-linking type photosensitive materials have a disadvantage in carrying out microscopic processing with high resolution that the exposed regions are swollen by the developing with an organic solvent.

In recent years, the molding materials used for overcoating flexible printed circuits, interlayer insulation films of multilayer substrates, insulation films and passivation films of solid elements in semiconductor industry, as well as the interlayer insulation materials of semiconductor integrated circuits and multilayer printed circuit boards are demanded to have good heat resistance. Further, the need to attain higher densification and higher integration demands photosensitive heat-resisting materials.

The semiconductor substrates which are used as semiconductor integrated parts in microelectronic industry are covered with photoresists. Photoresist relief structures are formed by forming images and subsequent development of the photoresist layers. The relief structures are used as the masks for preparing circuit patterns on the semiconductor substrates. By this processing cycle, the relief structure of a microchip can be transferred to a substrate.

Photoresists include two different types (positive-type photoresist and negative-type photoresist). These are different in that the exposed regions of the positive-type photoresist is removed by development so that the non-developed regions are left on the substrate, while the exposed regions of the negative-type photoresist are left as the relief structure. The positive-type photoresists have intrinsically high image resolutions so that they are suited for production of VLSIs (large scale integrated circuits).

Conventional positive-type photoresists contain a type of novolak resin which is soluble in aqueous alkali and a photosensitive quinone diazide which decreases the solubility of the resin in alkali. When the photoresist layer is irradiated, the quinone diazide is photoexcited so as to be converted to carboxylic acid, so that the solubility in alkali of the exposed regions is increased. Thus, by developing the photoresist with an aqueous alkali, a positive-type photoresist relief structure is obtained (USP 36664735 etc).

The characteristics of the photoresist compositions used in industries are the solubility of the photoresist in the solvent to be applied, the photosensitization rate of the photoresist, the developing contrast, the solubility of the developing solution acceptable from the view point of environment, adhesiveness of the photoresist, dimensional stability at high temperatures, and abrasion resistance.

The photoresist relief structures obtained by the exposure and development are usually subjected to heat treatment (postbake) at a temperature of 120° C. to 180° C. The purpose of this treatment is to promote the adhesiveness of the photoresist with the substrate, curing of the photoresist structure, and removal of all of the remaining volatile components to decrease the erosion in the subsequent etching step.

However, in plasma etching, the substrates are subjected to a temperature higher than 200° C. The photoresists containing as the base a novolak resin and a stabilizing improver cannot be thermally stabilized at a temperature of not lower than 180° C.

Polyimide resins are resistant to high temperature of about 400° C. and are stable to chemicals. Therefore, they are useful in forming heat-resisting photoresist layers.

Conventional polyimide photoresists are negative-type photoresists. The system of the negative-type photoresists is based on polyamic acid polymer having photoreactive side chains. However, this basic material has problems in that it has a poor storage stability, a very slow sensitizing rate, and an excess structural shrinkage after development and curing (the rate of shrinkage after baking is about 60%). With this composition, to attain a high resolution, exposure of about 10 minutes is necessary. Further, high concentration solutions thereof for forming thick films have especially poor storage stabilities (Tsuguo YAMAOKA et al., Polyfile 2, 14(1990).

It was shown that during the formation of the positive-type images, the polyimide composition having a weight average molecular weight of about 100,000 is dissolved in an alkaline solution and is converted to a composition having a weight average molecular weight of about 3000 (Takafumi FUKUSHIMA, Hiroshi ITATANI et al., Abstract of 49th Meeting of The Society of Polymer Science, Japan, (2000, Nagoya).

DISCLOSURE OF THE INVENTION

An object of the present invention is to provide a negative-type photosensitive polyimide composition which is solvent soluble, which is excellent in adhesiveness, heat resistance, mechanical properties and in flexibility, which shows characteristics of alkali-soluble highly sensitive negative-type photoresist upon irradiation with light.

The present inventors intensively studied to discover that a highly sensitive negative-type photosensitive polyimide solution composition, which polyimide is made to be alkali-soluble upon being irradiated with light, may be obtained by combining a solvent-soluble polyimide and a photo radical initiator, and that the insulation film made from the negative-type photosensitive polyimide solution composition is excellent in adhesiveness, heat resistance, mechanical properties and in flexibility, thereby completing the present invention.

That is, the present invention provides a negative-type photosensitive polyimide composition comprising a photo radical initiator and a solvent-soluble polyimide which shows negative-type photosensitivity in the presence of said photo radical initiator. The present invention also provides a method for forming a negative-type image made of polyimide, comprising coating a substrate with said composition according to the present invention; heating said composition at 70 to 110° C. and making said composition into the form of a film; irradiating said film with a light through a pattern mask; and immersing the resulting film in an alkali solution to develop said film.

By the present invention, a negative-type photosensitive polyimide which is made to be relatively insoluble in alkali by irradiation with light was provided. The negative-type photosensitive polyimide composition according to the present invention is highly sensitive, and very high image resolution is obtained. The insulation film made from the negative-type photosensitive polyimide composition according to the present invention is excellent in adhesiveness, heat resistance, mechanical properties and in flexibility. Therefore, the insulation film is a polyimide insulation film which has a heat resistance to high temperature, which is electric insulative, and which has adhesiveness, so that it may be widely used in the field of production of semiconductors, electronic parts and so on.

BEST MODE FOR CARRYING OUT THE INVENTION

The negative-type photosensitive polyimide composition according to the present invention comprises a solvent-soluble polyimide which shows negative-type photosensitivity in the presence of a radical initiator.

The term "radical initiator" herein means a compound which generates free radical upon being irradiated with light or electron beam. By the action of the free radical, the polyimide is crosslinked to become relatively insoluble in alkali. The radical initiator employed in the present invention is not restricted, and any compound which generates free radical upon being irradiated with light or electron beam may be employed. Various photo radical initiators are commercially available and these commercially available products may preferably be employed. Preferred radical initiators include bis-azide compounds, especially the bis-azide compounds in which azide (—N$_3$) groups are attached to two aromatic rings. Preferred examples of such bis-azide compounds include 4,4'-diazidestilbene, 2,6-di(4-azidebenzilidene)cyclohexane, 2,6-di(4-azidebenzilidene)-4-methoxycyclohexane and 4,4'-diazide-3,3'-dimethoxydiphenyl.

The content of the photo radical initiator is not restricted, and may preferably be about 10 to 30% by weight with respect to the total weight of the composition.

The polyimide contained in the polyimide composition according to the present invention is one produced by the direct imidization reaction between (a) diamine(s), preferably (a) aromatic diamine(s) and (a) tetracarboxylic dianhydride(s).

Preferred examples of the aromatic diamine component constituting the polyimide contained in the polyimide composition according to the present invention (described in the form of monomers) includes 4,4'-diaminodiphenyl ether, 3,4'-diaminodiphenyl ether, bis(4-phenoxy)1,4-benzene, bis(3-phenoxy)1,4-benzene, bis(3-phenoxy)1,3-benzene, 2,2-bis(4-aminophenyl)propane, 1,1,1,3,3,3-hexafluoro-2-bis(4-aminophenyl)propane, 4,4'-diaminodipehnylmethane, bis(4-aminophenoxy)4,4'-diphenyl, 2,2-bis {(4-aminophenoxy) phenyl }propane, 2,2-bis {(4aminophenoxy) phenyl}hexafluoropropane, 1,3-diaminobenzene, 1,4-diaminobenzene, 2,4-diaminotoluene, 3,3'-dimethyl-4,4'-diaminobiphenyl, 2,2'-bis(trifluoromethyl)benzidine, bis(4-aminophenoxy)-1,3-(2,2-dimethyl)propane and diaminosiloxane. These aromatic diamine components may be employed individually or in combination.

Preferred examples of the aromatic acid component constituting the polyimide contained in the polyimide composition according to the present invention (described in the form of monomers) includes 3,4,3',4'-benzophenonetetracarboxylic dianhydride, 3,4,3',4'-biphenyltetracarboxylic dianhydride, pyromellitic dianhydride, 2,3,3',4'-biphenyl ether tetracarboxylic dianhydride, 1,2,5,6-naphthalenetetracarboxylic dianhydride, 2,3,5,6-pyridinetetracarboxylic dianhydride, 3,4,3',4'-biphenylsulfonetetracarboxylic dianhydride, bicyclo(2,2,2)-oct-7-ene-2,3,5,6-tetracarboxylic dianhydride, 4,4'-{2 and 2,2-trifluoro-1-(trifluoromethyl)ethylidene}bis(1,2-benzenedicarboxylic dianhydride). These aromatic acid components may be employed individually or in combination.

It is preferred to employ one or more aromatic diamines, which have one or more carbonyl groups, nitro groups, methoxy groups, sulfonic groups, sulfide groups, anthracene groups and/or fluorene groups (hereinafter referred to as "photosensitive aromatic diamine"), as the one or more aromatic diamines constituting the polyimide, because they are easily photoexcited upon irradiation with UV after adding a photoacid generator, so that images can be formed with high sensitivity and high resolution with smaller dose of irradiation.

Preferred examples of the photosensitive aromatic diamine include 3,3'-dimethyl-4,4'-diamino-biphenylsulfone, 3,3'-dimethoxy-4,4'-diamino-biphenylsulfone, 4,4'-diaminodiphenyl sulfide, 4,4'-diaminodiphenyl disulfide, 9,9-bis(4-aminophenyl)fluorene, 1,4-diamino-2-nitrobenzene, 1,5-diamino-2-nitrobenzene, 3-nitro-4,4'-diaminobiphenyl, 3,3'-dinitro-4,4'-diaminobiphenyl, 2,4-diaminoacetophenone, 2,4-diaminobenzophenone, 2-amino-4'-aminobenzophenone, 2-amino-5-aminofluorene, 3,3'-diaminodiphenylsulfone, 4,4'-diaminodiphenylsulfone, bis-{4-(3-aminophenoxy)biphenyl}sulfone, bis-{4-(4-aminophenoxy)biphenyl}sulfone, bis {4-(4-aminophenoxy)phenyl }sulfone, bis {4-(3-aminophenoxy)phenyl}sulfone, o-tolidine sulfone, 4,4'-diaminobenzophenone, 3,3'-diaminobenzophenone, 2-nitro-1,4-diaminobenzene, 3,3'-dinitro-4,4'-diaminobiphenyl, 3,3'-dimethoxy-4,4'-diaminobiphenyl and 1,5-diaminonaphthalene.

The above-mentioned various photosensitive aromatic diamines may be employed individually or in combination.

By employing an aromatic diamine into which (a) hydroxyl group(s), a) pyridine group(s), (an) oxycarbonyl group(s) or (a) tertiary amine group(s) is introduced (hereinafter also referred to as "alkali-solubility-increasing aromatic diamine"), the aromatic diamine interacts with the alkali developer to become easily soluble in the alkali, so that negative-type images are more easily formed by alkali treatment.

Preferred examples of the alkali-solubility-increasing aromatic diamine include 2,6-diaminopyridine, 3,5-diaminopyridine, 3,5-diamino-2,4-dimethylpyridine, 1,4-diamino-2-hydroxybenzene, 3,3'-dihydroxy-4,4'-diaminobiphenyl and 3,3'-dimethoxy-4,4'-diaminobiphenyl, bis(3-amino-4-hydroxyphenyl)hexafluoropropane, 3,5-diaminobenzoic acid and 2-hydroxy-1,4-diaminobenzene.

The above-mentioned various photosensitive aromatic diamines may be employed individually or in combination.

The polyimide in the composition according to the present invention is solvent-soluble. The term "solvent-soluble" means that the polyimide can be dissolved in N-methyl-2-pyrrolidone (NMP) at a concentration of not less than 5% by weight, preferably not less than 10% by weight.

The polyimide in the composition according to the present invention preferably has a weight average molecular weight based on polystyrene of 30,000 to 400,000. If the weight average molecular weight is within the range of 30,000 to 400,000, good solubility in solvent, good film-forming properties, high film strength and high insulation may be attained. Further, in addition to satisfaction of the above-mentioned range of the molecular weight, it is preferred that the thermal decomposition initiation temperature be not lower than 450° C. from the view point of heat resistance.

The polyimide contained in the composition according to the present invention is preferably a polyimide generated by polycondensation between one or more acid dianhydrides and one or more aromatic diamines in the presence of an acid catalyst in an organic polar solvent. The acid catalyst is preferably a catalyst comprising a lactone and a base, and the polyimide is preferably one obtained by removing the water generated during the reaction by azeotropic distillation with toluene or xylene. Preferred examples of the organic polar solvent include at least one selected from the group consisting of N-methylpyrrolidone, N,N-dimethylformamide, N,N-dimethylacetamide, sulfolane and tetramethylurea.

The polyimide is preferably a polyimide block copolymer. By employing a block copolymer, an optional region which gives a desired property may be incorporated in the polyimide in an optional amount, so that the properties of the polyimide may be variously adjusted. Such a polyimide block copolymer may preferably be one having a ratio of total diamines to total tetracarboxylic anhydrides of 1.05 to 0.95, which copolymer is prepared by polycondensation process wherein a polyimide oligomer is first prepared by using either one of a tetracarboxylic dianhydride or a diamine in excess, then a tetracarboxylic dianhydride and/or diamine is(are) added, and the mixture is heated to carry out dehydration. The production process of the polyimide will be described in detail later.

The composition according to the present invention is preferably in the form of solution. As the solvent of the solution, the above-described organic polar solvents are preferred. In cases where the polyimide is produced by polycondensation in the organic polar solvent, the organic polar solvent used in the polycondensation may be used as the solvent of the solution composition as it is.

The concentration of the polyimide in the solution composition is preferably not less than 5% by weight, more preferably not less than 10% by weight.

The composition according to the present invention may preferably contain an olefin compound. By irradiating a composition containing an olefin compound with light, olefin polymer is generated, and the generated olefin polymer coexists with the polyimide molecules, so that the solubility to alkaline solution is decreased, and so clearer images may easily be formed.

The olefin compound is not restricted, and examples thereof include methacrylic acid and esters thereof, acrylic acid and esters thereof, styrene monomer and the like. Examples of the group constituting the esters include $C_1$-$C_6$ alkyl and hydroxyalkyl groups. Preferred examples of the olefin compound include (meth)acrylic acid (in the present specification and claims, "(meth)acrylic acid" means methacrylic acid and/or acrylic acid); $C_1$-$C_6$ alkyl(meth)acrylate; $C_1$-$C_6$ hydroxyalkyl(meth)acrylate such as 2-hydroxyethyl methacrylate and ethylene glycol dimethacrylate; and styrene.

The content of the olefin compound is not restricted and usually, 10 to 40% by weight with respect to the polyimide is preferred. The olefin compound may be added to the composition immediately before use.

When the polyimide film containing the olefin polymer is used as an insulation film, it is necessary to decompose and remove the olefin compound by heat. In this case, a heat treatment at a temperature of 200° C. or higher is carried out, and loss of the film by 30 to 40% by weight is resulted.

The polyimide in the composition according to the present invention may be produced by direct imidation reaction between the aromatic diamine and the aromatic tetracarboxylic dianhydride. In the production of the conventional negative-type polyimide photoresists, a polyamic acid having photoreactive side chains are used. The polyamic acid is easily decomposed at room temperature, so that the storage stability is poor. Further, the photosensitive polyamic acid requires heat treatment at 250 to 350° C. so as to carry out imidation reaction. In contrast, the polyimide in the composition according to the present invention is directly produced by the imidation reaction between the aromatic diamine and the aromatic tetracarboxylic dianhydride in solution, but not a polyamic acid, so that the production process thereof is largely different from that of the conventional negative-type polyimides.

The direct imidation reaction between the aromatic diamine and the tetracarboxylic dianhydride may be carried out using a catalytic system utilizing the following equilibrium reaction between a lactone, base and water.

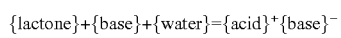

$$\{lactone\}+\{base\}+\{water\}=\{acid\}^+\{base\}^-$$

A polyimide solution may be obtained by using the $\{acid\}^+\{base\}^-$ system as a catalyst and heating the reaction mixture at 150-200° C., preferably 160-180° C. The water produced by the imidation reaction is eliminated from the reaction system by azeotropic distillation with toluene or xylene. When the imidation in the reaction system is completed, $\{acid\}^+\{base\}^-$ is converted to the lactone and the base, and they lose the catalytic activity and are removed from the reaction system. The polyimide solution produced by this process can be industrially used as it is as a polyimide solution with high purity because the above-mentioned catalytic substances are not contained in the polyimide solution after the reaction.

Examples of the reaction solvent which may be used in the above-mentioned imidation reaction include, in addition to the above-mentioned toluene or xylene, N-methyl-2-pyrrolidone, dimethylformamide, dimethylacetamide, dimethylsulfoxide, sulfolane, tetramethylurea and the like.

As the lactone, γ-valerolactone is preferred. As the base, pyridine and/or methylmorpholine is(are) preferred.

The mixing ratio (acid/diamine) between the acid dianhydride and the aromatic diamine subjected to the imidation reaction is preferably about 1.05 to 0.95 in terms of molar ratio. Further, the concentration of the acid dianhydride based on the total reaction mixture is preferably about 4 to 16% by weight, the concentration of the lactone is preferably about 0.2 to 0.6% by weight, the concentration of the base is preferably about 0.3 to 0.9% by weight, and the concentration of the toluene is preferably about 6 to 15% by weight at the initiation of the reaction. The reaction time is not restricted and varies depending on the molecular weight of the polyimide to be produced and the like, and usually about 2 to 10 hours. It is preferred to carry out the reaction under stirring in nitrogen gas stream.

It should be noted that the production process per se of the polyimide using the binary catalytic system comprising the lactone and the base is known, and described in, for example, U.S. Pat. No. 5,502,143.

By carrying out the above-described imidation reaction sequentially in two steps using different acid dianhydrides and/or different diamines, polyimide block copolymers can be produced. That is, using either one of a tetracarboxylic dianhydride or a diamine in excess, polycondensation is carried out by heating the reaction mixture at 150° C. to 200° C. to form a polyimide oligomer first, then a tetracarboxylic dianhydride and/or diamine is(are) added (in this case, the molar ratio of total tetracarboxylic dianhydrides to the total aromatic diamines is 1.05 to 0.95), and the mixture is heated to carry out dehydration, thereby obtaining the polyimide copolymer solution composition.

By the conventional process for producing polyimide through polyamic acid, only random copolymers can be produced as copolymers. Since polyimide block copolymers can be produced selecting arbitrary acids and/or diamines, desired properties or functions such as adhesiveness, dimensional stability, low dielectric constant and the like can be given to the polyimide. In the composition of the present invention, such a polyimide copolymer is preferably employed.

The photosensitive polyimide composition according to the present invention may be in the form of solution suited for application on substrates. In this case, as the solvent, a polar solvent such as N-methyl-2-pyrrolidone, dimethylformamide, dimethylacetamide, dimethylsulfoxide, sulfolane, tetramethylurea or the like, which is used as the solvent for the imidation reaction, may be employed. The concentration of the polyimide in the solution may preferably be 5% to 40% by weight, more preferably 10% to 30% by weight. Since the polyimide obtained by the direct imidation using the catalytic system comprising the lactone and the base is obtained in the form of solution in which the polyimide is dissolved in the polar solvent, and since the concentration of the polyimide in the obtained solution is within the preferred range mentioned above, the polyimide solution produced by the above-described process may advantageously be used as it is. If desired, however, the produced polyimide solution may be diluted with a diluent. As the diluent, a solvent which does not largely decrease the solubility, such as dioxane, dioxolane, γ-butyrolactone, cyclohexanone, propylene glycol monomethyl ether acetate, methyl lactate, anisole, ethyl acetate or the like may be employed, although the diluent is not restricted to these.

To make the composition of the present invention fitted to each final use, the sensitivity of the pattern resolution may be increased by giving a photosensitizer to the photosensitive polyimide of the present invention. Although not restricted, examples of the photosensitizer include Michler's ketone, benzoin ether, 2-methylanthraquinone, benzophenone and the like. Further, modifiers which are added to the ordinary photosensitive polyimides, such as coupling agents, plasticizers, film-forming resins, surfactants, stabilizers, spectrum sensitivity-adjusters and the like may be added.

By coating a substrate with the composition according to the present invention; heating the composition at 70 to 110° C. and making the composition into the form of a film; irradiating the film with a light through a pattern mask; and immersing the resulting film in an alkali solution to develop the film, a negative-type image made of the polyimide may be formed. Further, by washing the obtained negative-type image with water, and heating the resulting image at a temperature not higher than 250° C., a polyimide insulation film constituting the negative-type image may be obtained.

The method for forming the negative-type image will now be further described.

By applying the photosensitive polyimide composition of the present invention in the form of solution on a substrate, drying the composition, selectively exposing the composition, and developing the resultant, a polyimide film having an arbitrary pattern on the substrate can be formed. Alternatively, by forming a polyimide film from the polyimide composition by a conventional method such as extrusion, adhering the film on a substrate, selectively exposing the film and developing the resultant, a polyimide film having an arbitrary desired pattern on the substrate may be formed. Since such a polyimide film is resistant to heat and is insulative, it may be used as an insulation film or dielectric layer in semiconductor devices as it is. Alternatively, it may be used as a photoresist for selectively exposing the substrate.

Examples of the substrate to which the photosensitive polyimide of the present invention is applied include semiconductor disks, silicon wafers, germanium, gallium arsenide, glass, ceramics, copper foil, printed boards and the like.

Coating of the composition may be carried out usually by dipping, spraying, roll coating, spin coating or the like. As for the adhesive films, products having uniform thickness may be usually obtained by employing thermocompression bonding. By employing these methods, the photosensitive polyimide according to the present invention may be effectively used for forming coating layers with a thickness of 0.1 to 200 μm, or for forming relief structures.

The thin films in multilayered circuits used as temporary photoresists or as insulation layers or dielectric layers may preferably have a thickness of about 0.1 to 5 μm. In cases where the film is used as a thick layer such as immobile layer, the thickness thereof may preferably be 10 to 200 μm in order to protect the semiconductor memories from α-ray.

It is preferred to preliminarily dry the composition at a temperature of 70 to 120° C. after applying the photosensitive polyimide to the substrate. In this case, an oven or heating plate is used, and an infrared heater is preferably employed as the heater. The drying time in this case may be about 5 to 20 minutes.

Thereafter, the photosensitive polyimide layer is subjected to irradiation.

Usually, UV light is used, but high energy radiation, such as X-ray, electron beam or high power oscillation beam from an extra-high pressure mercury lamp may be employed. Although irradiation or exposure is carried out through a mask, the surface of the photosensitive polyimide layer may also be irradiated with the radiation beam. Usually, irradiation is carried out using a UV lamp which emits a light having a wavelength of 250 to 450 nm, preferably 300 to 400 nm. The exposure may be carried out using a single color ray or multiple color rays. It is preferred to use a commercially available irradiation apparatus, such as contact and interlayer exposing apparatus, scanning projector or wafer stepper.

After the exposure, by treating the photosensitive layer with a developer which is an aqueous alkaline solution, the irradiated regions of the photoresist layer can be removed, thereby a pattern is obtained. The treatment may be carried out by dipping the photoresist layer or spraying the developer under pressure to the photoresist layer so as to dissolve the exposed regions of the substrate. Examples of the alkali to be used as the developer include, although not restricted, aminoalcohols such as aminoethanol, methyl morpholine, potassium hydroxide, sodium hydroxide, sodium carbonate, dimethylaminoethanol, hydroxytetramethyl ammonium and the like. Although the concentration of the alkali in the developer is not restricted, it is usually about 30 to 5% by weight. The developing rate may be increased by adding a polar solvent such as NMP to the aqueous alkali solution.

The development time varies depending on the energy of exposure, strength of the developer, manner of development, preheating temperature, temperature of the treatment with the developer and the like. Usually, with the development by dipping, the development time is about 2 to 20 minutes, and with the development by spraying, the development time is usually about 1 to 10 minutes. The development is stopped by dipping the developed layer in an inactive solvent such as isopropanol or deionized water, or by spraying such a solvent.

By using the positive-type photosensitive polyimide composition according to the present invention, polyimide coating layers having a layer thickness of 0.5 to 200 μm, and relief structures having sharp edges may be formed.

Since the polyimide in the composition of the present invention is composed of complete linear polyimide, it is not changed in water or heating, and its storage stability is good. Therefore, it can be used as photosensitive films. Further, after forming the pattern by development, unlike the polyamic acid molecules, the postbake at 250 to 450° C. is not necessary, and only drying under heat at 160 to 250° C. to evaporate the solvent is carried out. Further, the polyimide film after forming the pattern is tough, resistant to high temperature and excellent in mechanical properties.

By adding to the polyimide solution composition according to the present invention an olefin compound which undergoes radical polymerization, a negative-type image may be formed.

With the polyimide solution composition, an olefin compound and a radical initiator are mixed, and the resulting mixture is irradiated with light through a pattern mask. By virtue of the generated free radical, the olefin compound becomes a radical polymer which coexists with the polyimide, so that the solubility in the alkali developer is decreased to form a negative-type image.

Formation of the negative-type image by the polyimide solution composition will now be discussed.

In the conventional method for forming a negative-type image, an acid dianhydride and an aromatic diamine are reacted in anhydrous condition in a polar solvent at a low temperature to obtain a high molecular weight polyamic acid solution. The polyamic acid is easily decomposed by addition of water or by heating. Further, the decomposition of the polyamic acid is accelerated by aqueous alkaline solution. The quality assurance of polyamic acid is generally defined by intrinsic viscosity. However, indication of the quality of the polyamic acid by the intrinsic viscosity is insufficient, and reproduction is difficult. Since the composition of the polyamic acid changes, the measurement of the molecular weight and the molecular weight distribution by GPC cannot be generally employed. Methacrylic acid ester of this unstable polyamic acid is prepared, and the resultant is subjected to radical polymerization so as to make the product relatively insoluble in alkali solution, thereby forming a negative-type image.

The method for forming negative-type images by using the polyimide solution composition according to the present invention is characterized by the fact that the acid dianhydride(s) and the aromatic diamine(s) are polycondensed in the presence of the catalyst to directly form the polyimide composition. The polyimide molecules are stable in storage and are not decomposed by addition of water and warming. Intramolecular exchange reaction does not occur. Therefore, the molecular weight and the molecular weight distribution of the polyimide can be measured by GPC, and the polyimide can be produced with good reproducibility so that the quality of the polyimide can be assured.

In cases where a multi-component polyimide is synthesized, polyamic acid undergoes intramolecular exchange reaction to become a random copolymer, so that improvement of the polyimide molecules is difficult. By the direct imidization reaction according to the present invention, by the sequential addition, polyimide block copolymer is formed, so that improvement of polyimide is easy.

The reaction is shown in the following chart.

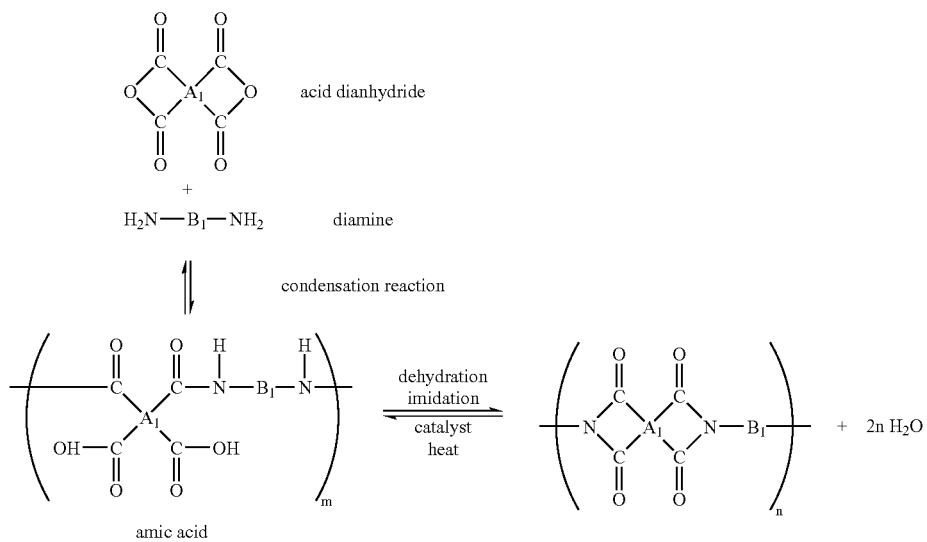

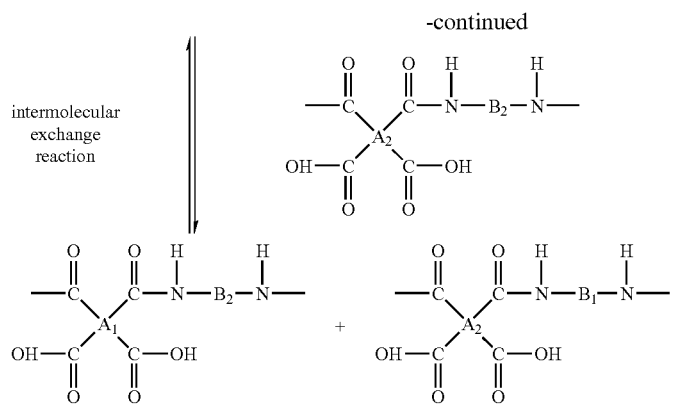

On the other hand, by adding a radical initiator, preferably a bis-radical initiator to the polyimide solution composition and by irradiating the composition with light, the generated radical crosslinks the polyimide molecules so that the polyimide molecules become macromolecules and so the solubility in the alkali solution is decreased. Therefore, by irradiating the polyimide with light through an photomask, the non-irradiated regions of the polyimide layer are dissolved in the alkaline solution to form a negative-type image.

By adding an olefin compound, that is, methacrylic acid and/or acrylic acid derivative, and/or styrene, and the radical initiator, and by irradiating the composition with light, olefin polymers are produced and the olefin polymers coexist with the polyimide molecules, so that the solubility in the alkaline solution is decreased. Thus, a negative-type image is formed. The polyimide solution composition containing the olefin is useful as a negative-type photoresist. However, if it is used as a heat resistant insulation film, it is necessary to remove the olefin compound by heat treatment, and the loss of the film is large.

The polyimide composition forming a negative-type image by using the radical initiator has the following characteristics:

(1) Compounds having hydrogen bonds such as —NH—, CH$_3$—, —CH$_2$—, =CH—, —COOH, —OH and the like are easily crosslinked by the radical, preferably bis-radical to form negative-type images with high sensitivity and high resolution.

(2) Since the polyimides having methyl groups, nitro groups and/or trifluoromethyl groups at the sites adjacent to the amino groups; polyimides having electron-attracting groups (nitro group, carbonyl group, trifluoromethyl group, sulfonic group); and the polyimides having hydroxyl groups and oxycarbonyl groups are easily dissolved in alkaline solution, negative-type images with high sensitivity and high resolution are formed.

(3) There is an influence by the molecular weight and the molecular weight distribution of the polyimide. Since the polyimide having a large molecular weight requires a long time for development with an alkali, low molecular polyimide is highly sensitive. In cases where the weight average molecular weight in terms of polystyrene is not more than 50,000, especially not more than 30,000, the polyimide film has a poor insulative property, tensile strength and heat resistance. In cases where the polyimide is used as an insulation film, the polyimide preferably has a weight average molecular weight of not less than 50,000.

By adding a photoacid generator to the polyimide solution composition and by irradiating the composition with light, the polyimide molecules are cleaved to decrease the molecular weight, and becomes soluble in alkaline solution. Therefore, by irradiating the composition with light through a photomask, the irradiated region is dissolved in alkaline solution to form positive images.

In general, positive-type images made from the polyimide composition are developed in a short time. Forming negative-type images from the polyimide composition has an advantage that the contents of impurities contained in the polyimide are small so that highly pure insulation films are formed.

In the Examples, formation of negative-type images, formation of negative-type images with addition of acrylic acid or styrene, and formation of positive-type images with addition of a photoacid generator, using a polyimide composition having the same composition, will be compared.

EXAMPLES

The present invention will now be described in detail referring to some examples and comparative examples thereof.

Since characteristic photosensitive polyimide copolymers are obtained by various combinations of acid dianhydrides and aromatic diamines, the present invention is not restricted to these examples.

Example 1

To a three-necked separable flask equipped with a stainless steel anchor agitator, a condenser comprising a trap for water separation and a cooling tube having balls was attached.

To the flask, 19.33 g (60 mmol) of 3,4,3',4'-benzophenonetetracarboxylic dianhydride (hereinafter referred to as "BTDA"), 3.66 g (30 mmol) of 2,4-diaminotoluene, 1.2 g (12 mmol) of γ-valerolactone, 1.9 g (24 mmol) of pyridine, 150 g of N-methylpyrrolidone (hereinafter referred to as "NMP") and 50 g of toluene were added.

At room temperature under nitrogen atmosphere, the mixture was stirred at 180 rpm for 1 hour. The mixture was heated to 180° C. and stirred at 180 rpm for 1 hour. After the reaction, the toluene-water azeotrope was removed.

Then 17.65 g (60 mmol) of 3,4,3',4'-biphenyltetracarboxylic dianhydride (hereinafter referred to as "BPDA"), 12.98 g (30 mmol) of bis{4-(4-aminophenoxy)phenyl}sulfone, 6.01 g (30 mmol) of 3,4'-diaminodiphenyl ether, 8.77 g (30 mmol) of bis(3-aminophenoxy-1,4-benzene, 97 g of NMP and 30 g of toluene were added.

At room temperature under nitrogen atmosphere, the mixture was stirred at 180 rpm for 0.5 hour, and the mixture was then heated to 180° C., followed by stirring at 180 rpm for 2 hours. During the reaction, the toluene-water azeotrope was removed. Thereafter, 103 g of NMP was added.

The polymer concentration of the thus obtained polyimide solution was 15% by weight. The molecular weight of this polyimide was measured by high performance liquid chromatography (product of Tosoh Corporation). The molecular weights in terms of polystyrene were: Number Average Molecular Weight (Mn): 25,800; Weight Average Molecular Weight (Mw): 84,900; Z Average Molecular Weight (Mz): 225,000; Mw/Mn=3.29; Mz/Mn=8.72.

Example 2

Preparation of Photosensitive Compositions and Formation of Pattern by Selective Exposure (1) Preparation of Photosensitive Composition Twenty grams of the polyimide solution (polyimide content: 15% by weight) prepared in Example 1 was taken, and 0.6 g (20% by weight with respect to the polyimide resin) of a radical initiator, 2,6-bis(9-azidebenzilidene)-4-methylcyclohexane (hereinafter referred to as "BAC-M") (product of Toyo Gosei Kogyo Co., Ltd.) was added thereto, followed by mixing the mixture. This mixed solution was filtered through a filter having a pore size of 0.3 pm to prepare a photosensitive composition.

(2) Formation of Images

The composition was applied on the surface of a surface-treated copper foil having a diameter of 5 cm (commercial product of Mitsui Metal and Mining Co., Ltd.: thickness 18 μm), and dried by an infrared dryer at 90° C. for 10 minutes. The thickness of the photoresist film was about 8 μm.

On this photosensitive coating film, a test pattern (through holes and line-and space patterns of 15, 20, 25, - - -, 200 μm, respectively) for negative-type photomask was placed, and the photosensitive film was irradiated at a dose of exposure at which images are obtained using 2 kW extra-high pressure mercury lamp apparatus (JP-2000G, commercial product of Oak Seisakusho). The wavelength region was 320 to 390 nm, and the peak was 360 nm (same in the following Examples).

The developer was a mixture of 30 g of aminoethanol, 30 g of N-methylpyrrolidone and 30 g of water (hereinafter referred to as "developer:A0"). In the A0 solution placed in an ultrasonic washer and subjected to ultrasonication, the above-described coating film after the irradiation was immersed at 40° C. for 20 minutes, and then washed with deionized water. The resultant was dried with an infrared lamp and the resolution was observed. The thickness of the polyimide coating film after the drying treatment at 90° C. for 30 minutes was about 6 μm.

With this polyimide coating film, as for the through hole patterns, formation of through holes having sharp and circular sections having a diameter of 15 μm was confirmed. As for the line-and-space pattern, formation of images of lines having a width of 15 82 m was confirmed. By subjecting the polyimide film to heat treatment at 140° C. for 30 minutes and at 200° C. for 20 minutes in an infrared dryer, a copper substrate with good adhesiveness was obtained.

Example 3

Twenty grams of the polyimide solution prepared in Example 1 was taken, and 0.6 g of the radical initiator BAC-M and 0.9 g (30% by weight with respect to the polyimide resin) of ethylene glycol methacrylate (hereinafter referred to as "EGM") are added thereto, followed by mixing the mixture. This mixed solution was filtered through a filter having a pore size of 0.3 μm to prepare a photosensitive composition. As in Example 2, with the formed polyimide coating film, as for the through hole patterns, formation of through holes having sharp and circular sections having a diameter of 15 μm was confirmed. As for the line-and-space pattern, formation of images of lines having a width of 15 μm was confirmed.

Example 4

Twenty grams of the polyimide solution prepared in Example 1 was taken, and 0.6 g of the radical initiator BAC-M and 0.9 g (30% by weight with respect to the polyimide resin) of styrene monomer are added thereto, followed by mixing the mixture. This mixed solution was filtered through a filter having a pore size of 0.3 μm to prepare a photosensitive composition. As in Example 2, with the formed polyimide coating film, as for the through hole patterns, formation of through holes having sharp and circular sections having a diameter of 15 μm was confirmed. As for the line-and-space pattern, formation of images of lines having a width of 15 μm was confirmed.

Comparative Example 1

Twenty grams of the polyimide solution prepared in Example 1 was taken, and 0.45 g (15% by weight with respect to the polyimide resin) of a radical initiator NT-200 (triester between 2,3,4-trihydroxybenzophenone and 1-diazo-5,6-dihydro-5-oxo-naphthalene-1-sulfonic acid) (commercial product of Toyo Gosei Co., Ltd.) as a positive-type photosensitizer and 0.45 g (15% by weight with respect to the polyimide resin) of isopropyl benzoate are added, followed by mixing the mixture. This mixed solution was filtered through a filter having a pore size of 0.3 μm to prepare a photosensitive composition. As in Example 2, with the formed polyimide coating film, as for the through hole patterns, formation of through holes having sharp and circular sections having a diameter of 15 μm was confirmed. The conditions and the results of the above-described experiments are summarized in Table 1.

TABLE 1

Experimental Conditions and Experimental Results of Polyimide Resists

| Resist Item | Example 2 | Example 3 | Example 4 | Comparative Example 1 |
|---|---|---|---|---|
| Polyimide Content | 3 g | 3 g | 3 g | 3 g |
| Radical Initiator | BAC-M | BAC-M | BAC-M | — |
| Added Amount | 0.6 g | 0.6 g | 0.6 g | |
| Additive | — | EGM | Styrene | NT-200 |

TABLE 1-continued

Experimental Conditions and Experimental Results of Polyimide Resists

| Resist Item | Example 2 | Example 3 | Example 4 | Comparative Example 1 |
|---|---|---|---|---|
| Added Amount | | 0.9 g | 0.9 g | 0.45 g |
| Prebaking | 90° C. 10 min. | " | " | " |
| Film Thickness (μm) | 8 | 10 | 10 | 10 |
| UV Dose (mj) | 330 | 1000 | 1000 | 330 |
| Developer | A0 | A0 | A0 | A0 |
| Developing Tempreture | 45° C. | 48° C. | 45° C. | 40° C. |
| Developing Time | 24 min. | 15 min. | 20 min. | 11 min. |
| Postbaking Tempreture | 90° C. | 90° C. | 90° C. | 90° C. |
| Time | 30 min. | 1 hr. | 45 min. | 30 min. |
| Film Thickness (μm) | 6 | 7 | 6 | 7 |
| Resolution (μm) | 15 | 15 | 20 | 15 |
| | negative-type | negative-type | negative-type | positive-type |
| | ◎ | ◎ | ○ | ◎ |
| Adhesiveness | ◎ | ◎ | ○ | ○ |

Resolution, Adhesiveness:
◎ very good
○ good
Δ little bad

Example 5

The operations similar to Example 1 were repeated.

16.11 g (50 mmol) of BTDA, 3.00 g (25 mmol) of 2,4-diaminotoluene, 1.0 g (10 mmol) of γ-valerolactone, 1.6 g (20 mmol) of pyridine, 200 g of NMP and 30 g of toluene were fed.

Under nitrogen atmosphere, the mixture was stirred at 180 rpm for 0.5 hour and then the mixture was heated to 180° C., followed by stirring the resulting mixture at 180 rpm for 1 hour.

After cooling the mixture to room temperature, 14.71 g (50 mmol) of BPDA, 205.3 g (50 mmol) of 2,2-bis{4-(4-aminophenoxy)phenylpropane, 7.31 g (25 mmol) of 1,4-bis(3-aminophenoxy)benzene, 180 g of NMP and 20 g of toluene were added.

Under nitrogen atmosphere, the mixture was stirred at room temperature for 1 hour, and the mixture was heated to 180° C., followed by stirring the mixture at 180 rpm for 1 and half hours. During the reaction, toluene-water azeotrope was removed. The mixture was then stirred at 180° C. at 100 rpm for 30 minutes.

The polymer concentration of the thus obtained polyimide solution was 13% by weight. The molecular weight of this polyimide was measured as in Example 1. The molecular weights in terms of polystyrene were: Number Average Molecular Weight (Mn): 33,900; Weight Average Molecular Weight (Mw): 74,500; Z Average Molecular Weight (Mz): 146,000; Mw/Mn=2.19; Mz/Mn=4.31.

Example 6

The operations similar to Example 1 were repeated.

9.93 g (40 mmol) of bicyclo(2,2,2)-oct-7-ene2,3,5,6-tetracarboxylic dianhydride (hereinafter referred to as "BCD"), 12.01 g (60 mmol) of 4,4-diaminodiphenyl ether, 1.0 g (10 mmol) of γ-valerolactone, 2.0 g (20 mmol) of N-methylmorpholine, 150 g of NMP and 20 g of toluene are fed. During the reaction, toluene-water azeotrope was removed.

Under nitrogen atmosphere, the mixture was stirred at 180 rpm at room temperature for 0.5 hour, and the mixture was heated to 180° C., followed by stirring the mixture at 180 rpm for 1 hour.

After cooling the mixture to room temperature, 17.65 g (60 mmol) of BPDA, 4.25 g (20 mmol) of 3,3'-dimethyl-4,4'-diaminobiphenyl, 6.5 g (22.5 mmol) of bis(3-aminophenoxy)1,4-benzene, 100 g of NMP and 40 g of toluene were added.

Under nitrogen atmosphere, the mixture was stirred at room temperature for 1 hour, and the mixture was heated to 180° C., followed by stirring the mixture at 180 rpm for 1 hour. During the reaction, toluene-water azeotrope was removed. Then 0.74 g (5 mmol) of phthalic anhydride and 15 g of NMP were added, and the mixture was stirred at 180° C. at 180 rpm for 70 minutes.

The polymer concentration of the thus obtained polyimide solution was 15% by weight. The molecular weight of this polyimide was measured as in Example 1. The molecular weights in terms of polystyrene were: Number Average Molecular Weight (Mn): 23,600; Weight Average Molecular Weight (Mw): 42,900; Z Average Molecular Weight (Mz): 68,200; Mw/Mn=1.81; Mz/Mn=2.89.

Example 7

The operations similar to Example 1 were repeated.

19.86 g (80 mmol) of BCD, 24.02 g (120 mmol) of 3,4'-diaminodiphenyl ether, 2.0 g (20 mmol) of γ-valerolactone, 3.2 g (40 mmol) of pyridine, 200 g of NMP and 40 g of toluene are fed. The mixture was heated to 180° C. and stirred at 180 rpm for 1 hour, followed by removing the toluene-water azeotrope.

After cooling the mixture to room temperature, 38.67 g (120 mmol) of BTDA, 23.38 g (80 mmol) of bis(3-aminophenoxy)-1,3-benzene, 458 g of NMP and 40 g of toluene were added.

Under nitrogen atmosphere, the mixture was stirred at room temperature for 1 hour, and the mixture was heated to 180° C., followed by stirring the mixture at 180 rpm for 4 hours and 20 minutes. During the reaction, toluene-water azeotrope was removed.

The polymer concentration of the thus obtained polyimide solution was 13% by weight. The molecular weight of this polyimide was measured as in Example 1. The molecular weights in terms of polystyrene were: Number Average Molecular Weight (Mn): 84,100; Weight Average Molecular Weight (Mw): 133,600; Z Average Molecular Weight (Mz): 200,500; Mw/Mn=1.59; Mz/Mn=2.38.

Example 8

Preparation of Photosensitive Compositions and Formation of Pattern by Selective Exposure In the same manner as in Example 2, photosensitive compositions were prepared and images were formed therefrom.

The conditions and the results of the above-described experiments are summarized in Tables 2 and 3.

TABLE 2

Experimental Conditions and Experimental Results of Polyimide Resists

| Resist Item | Example 5 | Example 6-1 | Example 6-2 |
|---|---|---|---|
| Polyimide Content | 3 g | 3 g | 3 g |
| Radical Initiator | BAC-M | BAC-M | BAC-M |
| Added Amount | 0.6 g | 0.6 g | 0.6 g |
| Additive | — | — | EGM |
| Added Amount | — | — | 0.9 g |
| Prebaking | 90° C. 8 min. | 90° C. 10 min. | 90° C. 10 min. |
| Film Thickness (μm) | 10 | 10 | 10 |
| UV Dose (mj) | 700 | 1000 | 1000 |
| Developer | A0 | A0 | A0 |
| Developing Tempreture | 42° C. | 43° C. | 45° C. |
| Developing Time | 12 min. | 50 min. | 39 min. |
| Postbaking Temperature in Former Step | 90° C. | 90° C. | 90° C. |
| Time of Former Step | 30 min. | 30 min. | 30 min. |
| Temperature in Latter Step | 180° C. | — | — |
| Time of Latter Step | 30 min. | — | — |
| Film Thickness (μm) | 7 | 8 | 7 |
| Resolution (μm) | 15 negative-type ◉ | 15 negative-type ◉ | 20 negative-type ○ |
| Adhesiveness | ◉ | ◉ | ○ |

Resolution, Adhesiveness:
◉ very good
○ good
Δ little bad

TABLE 3

Experimental Conditions and Experimental Results of Polyimide Resists

| Resist Item | Example 7-1 | Example 7-2 | Comparative Example 2 |
|---|---|---|---|
| Polyimide Content | 3 g | 3 g | 3 g |
| Radical Initiator | BAC-M | BAC-M | — |
| Added Amount | 0.6 g | 0.6 g | 0.6 g |
| Additive | — | EGA | NT-200 |
| Added Amount | — | 0.9 g | 0.6 g |
| Prebaking Tempreture | 80° C. | 90° C. | 90° C. |
| Prebaking Time | 10 min. | 10 min. | 10 min. |
| Film Thickness (μm) | 3 | 3 | 5 |
| UV Dose (mj) | 500 | 500 | 300 |
| Developer | A0 | A0 | A0 |
| Developing Tempreture | 45° C. | 45° C. | 40° C. |
| Developing Time (min./sec.) | 12/00 | 15/00 | 9/30 |
| Postbaking Temperature in Former Step | 90° C. | 90° C. | 90° C. |
| Time of Former Step | 30 min. | 30 min. | 1 hr. |
| Temperature in Latter | 180 | 180 | — |
| Time of Latter Step | 45 min. | 30 min. | — |
| Film Thickness (μm) | 2 | 6 | 4 |
| Resolution (μm) | 20 negative-type ○ | 30 negative-type ○ | 15 positive-type ◉ |
| Adhesiveness | ◉ | Δ | ○ |

Resolution, Adhesiveness:
◉ very good
○ good
Δ little bad

Example 9

The operations similar to Example 1 were repeated.

44.67 g (180 mmol) of BCD, 19.46 g (90 mmol) of 3,3'-dihydroxy-4,4-diaminobiphenyl, 2.7 g (27 mmol) of γ-valerolactone, 4.3 g (53 mmol) of pyridine, 250 g of NMP and 30 g of toluene were fed.

Under nitrogen atmosphere, the mixture was stirred at 180 rpm at room temperature for 0.5 hour, and the mixture was heated to 180° C., followed by stirring the mixture at 180 rpm for 1 hour. During the reaction, toluene-water azeotrope was removed.

After cooling the mixture to room temperature, 26.48 g (90 mmol) of BPDA, 18.02 g (90 mmol) of 3,4'-diaminodiphenyl ether, 26.31 g (90 mmol) of bis-(3-aminophenoxy)-1,4-benzene, 251 g of γ-valerolactone and 40 g of toluene were added.

Under nitrogen atmosphere, the mixture was stirred at room temperature for 1 hour, and the mixture was heated to 180° C., followed by stirring the mixture at 180 rpm for 1 hour and 30 minutes. Thereafter, the mixture was stirred at 100 rpm for 1 hour and 14 minutes. During the reaction, toluene-water azeotrope was removed.

The polymer concentration of the thus obtained polyimide solution was 20% by weight. The molecular weight of this polyimide was measured as in Example 1. The molecular weights in terms of polystyrene were: Number Average Molecular Weight (Mn): 26,700; Weight Average Molecular Weight (Mw): 57,900; Z Average Molecular Weight (Mz): 109,000; Mw/Mn=2.17; MztMn=4.09.

Example 10

The operations similar to Example 1 were repeated.

11.77 g (40 mmol) of biphenyltetracarboxylic dianhydride (hereinafter referred to as "BPDA"), 20.41 g (60 mmol) of bis(4-aminophenyl)fluorene, 1.0 g (10 mmol) of γ-valerolactone, 1.6 g (20 mmol) of pyridine, 134 g of NMP and 20 g of toluene were fed. The mixture was stirred at 180° C. at 180 rpm for 1 hour. During the reaction, toluene-water azeotrope was removed.

After cooling the mixture to room temperature, 26.66 g of 2,2-bis(3,4-dicarboxyphenyl)-1,1,1,3,3,3-hexafluoropropane (hereinafter referred to as "6FDA"), 4.24 g (20 mmol) of 2,2'-dimethyl-4,4'-diaminobiphenyl, 7.33 g (20 mmol) of bis (3-amino-4-hydroxyphenyl)hexafluoropropane, 135 g of NMP and 30 g of toluene were added.

Under nitrogen atmosphere, the mixture was stirred at room temperature for 0.5 hour, and the mixture was heated to 180° C., followed by stirring the mixture at 180 rpm for 2 hours and 45 minutes.

The polymer concentration of the thus obtained polyimide solution was 20% by weight. The molecular weight of this polyimide was measured as in Example 1. The molecular weights in terms of polystyrene were: Number Average Molecular Weight (Mn): 33,700; Weight Average Molecular Weight (Mw): 74,700; Z Average Molecular Weight (Mz): 128,000; Mw/Mn=2.21; Mz/Mn=3.78.

Example 11

The operations similar to Example 1 were repeated.

32.23 g (100 mmol) of BTDA, 6.11 g (50 mmol) of 2,4-diaminotoluene, 2.0 g (20 mmol) of γ-valerolactone, 3.2 g (20 mmol) of pyridine, 192 g of NMP and 30 g of toluene were fed. The mixture was stirred at 180° C. at 180 rpm for 1 hour. During the reaction, toluene-water azeotrope was removed.

After cooling the mixture to room temperature, 29.42 g (100 mmol) of BPDA, 10.81 g (50 mmol) of 3,3'-dihydroxy-4,4'-diaminobiphenyl, 14.62 g (50 mmol) of bis(3-aminophenoxy)-1,4-benzene, 10.01 g (50 mmol) of 3,4'-diaminodiphenyl ether, 192 g of NMP and 30 g of toluene were added.

Under nitrogen atmosphere, the mixture was stirred at room temperature for 0.5 hour, and the mixture was heated to 180° C., followed by stirring the mixture at 180 rpm for 1 hour. The mixture was then heated at 180° C. at 100 rpm for 45 minutes. During the reaction, toluene-water azeotrope was removed.

The polymer concentration of the thus obtained polyimide solution was 20% by weight. The molecular weight of this polyimide was measured as in Example 1. The molecular weights in terms of polystyrene were: Number Average Molecular Weight (Mn): 24,600; Weight Average Molecular Weight (Mw): 79,600; Z Average Molecular Weight (Mz): 212,000; Mw/Mn=3.24; Mz/Mn=8.62.

Example 12

The operations similar to Example 1 were repeated.

25.78 g (80 mmol) of BTDA, 4.87 g (40 mmol) of 2,4-diaminotoluene, 1.6 g (16 mmol) of γ-valerolactone, 2.6 g (32 mmol) of pyridine, 267 g of NMP and 60 g of toluene were fed. The mixture was stirred at 180° C. at 180 rpm for 1 hour. During the reaction, toluene-water azeotrope was removed.

After cooling the mixture to room temperature, 23.54 g (80 mmol) of BPDA, 8.65 g (40 mmol) of 3,3'-dihydroxy-4,4'-diaminobiphenyl, 8.01 g (40 mmol) of 3,4'-diaminodiphenyl ether, 17.3 g (40 mmol) of bis{4-(4-aminophenoxy)phenyl}sulfone, 200 g of NMP and 50 g of toluene were added.

Under nitrogen atmosphere, the mixture was stirred at room temperature for 0.5 hour, and the mixture was heated to 180° C., followed by stirring the mixture at 180 rpm for 2 hours. Then 275 g of NMP was added, and the mixture was stirred at 180° C. at 100 rpm for 2 hours and 40 minutes. During the reaction, toluene-water azeotrope was removed.

The polymer concentration of the thus obtained polyimide solution was 10% by weight. The molecular weight of this polyimide was measured as in Example 1. The molecular weights in terms of polystyrene were: Number Average Molecular Weight (Mn): 36,500; Weight Average Molecular Weight (Mw): 198,800; Z Average Molecular Weight (Mz): 283,600; Mw/Mn=15.4; Mz/Mn=16.

Example 13

The operations similar to Example 1 were repeated.

29.78 g (120 mmol) of bicyclo(2,2,2)-oct-2,3,5,6-tetracarboxylic dianhydride (hereinafter referred to as "BCD"), 12.97 g (60 mmol) of 3,3'-dihydroxy-4,4'-diaminobiphenyl, 1.8 g (18 mmol) of γ-valerolactone, 2.9 g (36 mmol) of pyridine, 250 g of NMP and 30 g of toluene were fed. The mixture was stirred at 180° C. at 180 rpm for 1 hour. During the reaction, toluene-water azeotrope was removed.

After cooling the mixture to room temperature, 17.65 g (60 mmol) of BPDA, 25.95 g (60 mmol) of bis{4-(3-aminophenoxy)phenyl}sulfone, 24.63 g (60 mmol) of 2,2-bis{4-(4-aminophenoxy)phenyl}propane, 226 g of NMP and 30 g of toluene were added.

Under nitrogen atmosphere, the mixture was stirred at room temperature for 0.5 hour, and the mixture was heated to 180° C., followed by stirring the mixture at 180 rpm for 3 hours. During the reaction, toluene-water azeotrope was removed.

The polymer concentration of the thus obtained polyimide solution was 18% by weight. The molecular weight of this polyimide was measured as in Example 1. The molecular weights in terms of polystyrene were: Number Average Molecular Weight (Mn): 26,300; Weight Average Molecular Weight (Mw): 44,200; Z Average Molecular Weight (Mz): 66,000; Mw/Mn=1.68; Mz/Mn=2.50.

Example 14

Preparation of Photosensitive Compositions and Formation of Pattern by Selective Exposure In the same manner as in Example 2, photosensitive compositions were prepared and images were formed therefrom.

The conditions and the results of the above-described experiments are summarized in Tables 4, 5, 6 and 7.

TABLE 4

Experimental Conditions and Experimental Results of Polyimide Resists

| Resist Item | Example 9 | Comparative Example 3 | Example 10-1 |
|---|---|---|---|
| Polyimide Content | 3 g | 3 g | 3 g |
| Radical Initiator | BAC-M | — | BAC-M |
| Added Amount | 0.6 g | — | 0.6 g |
| Additive | — | NT-200 | — |
| Added Amount | — | 0.45 g | — |
| Prebaking | 90° C. 10 min. | 90° C. 10 min. | 90° C. 10 min. |
| Film Thickness (μm) | 9 | 12 | 8 |
| UV Dose (mj) | 700 | 300 | 330 |
| Developer | A0 | A0 | A0 |
| Developing Tempreture | 43° C. | 40° C. | 44° C. |
| Developing Time (min./sec.) | 10/00 | 2/20 | 15/00 |
| Postbaking Tempreture in Former Step | 90° C. | 90° C. | 90° C. |
| Time of Former Step | 30 min. | 30 min. | 30 min. |
| Tempreture in Latter Step | 180° C. | — | — |
| Time of Latter Step | 30 min. | — | — |
| Film Thickness (μm) | 6 | 10 | 6 |
| Resolution (μm) | 15 negative-type ⊚ | 15 positive-type ⊚ | 15 negative-type ⊚ |
| Adhesiveness | ⊚ | ⊚ | ○ |

Resolution, Adhesiveness:
⊚ very good
○ good
Δ little bad

TABLE 5

Experimental Conditions and Experimental Results of Polyimide Resists

| Resist Item | Example 10-2 | Example 11-1 | Example 11-2 |
|---|---|---|---|
| Polyimide Content | 3 g | 3 g | 3 g |
| Radical Initiator | BAC-M | BAC-M | BAC-M |
| Added Amount | 0.6 g | 0.6 g | 0.6 g |
| Additive | EGA | — | EGA |
| Added Amount | 0.9 g | — | 0.9 g |
| Prebaking | 90° C. 10 min. | 90° C. 10 min. | 90° C. 10 min. |
| Film Thickness (μm) | 8 | 10 | 15 |
| UV Dose (mj) | 1000 | 1000 | 1000 |
| Developer | A0 | A0 | A0 |
| Developing Tempreture | 45° C. | 45° C. | 40° C. |
| Developing Time (min./sec.) | 19/00 | 10/00 | 9/00 |
| Postbaking Tempreture in Former Step | 90° C. | 90° C. | 90° C. |
| Time of Former Step | 30 min. | 30 min. | 30 min. |
| Tempreture in Latter Step | 180° C. | — | — |
| Time of Latter Step | 3 hr. | — | — |
| Film Thickness (μm) | 6 | 8 | 7 |
| Resolution (μm) | 15 | 15 | 15 |
| | negative-type | negative-type | negative-type |
| | ○ | ◎ | ◎ |
| Adhesiveness | ○ | Δ | ◎ |

Resolution, Adhesiveness:
◎ very good
○ good
Δ little bad

TABLE 6

Experimental Conditions and Experimental Results of Polyimide Resists

| Resist Item | Comparative Example 4 | Example 12-1 |
|---|---|---|
| Polyimide Content | 3 g | 3 g |
| Radical Initiator | — | BAC-M |
| Added Amount | — | 0.6 g |
| Additive | PC-5 | — |
| Added Amount | 0.6 g | — |
| Prebaking | 90° C. 10 min. | 90° C. 10 min. |
| Film Thickness (μm) | 10 | 10 |
| UV Dose (mj) | 1000 | 1000 |
| Developer | A0 | A0 |
| Developing Tempreture | 40° C. | 46° C. |
| Developing Time (min./sec.) | 10/00 | 14/00 |
| Postbaking Tempreture in Former Step | 90° C. | 90° C. |
| Time of Former Step | 30 min. | 30 min. |
| Tempreture in Latter Step | 180° C. | 180° C. |
| Time of Latter Step | 30 min. | 30 min. |
| Film Thickness (μm) | 8 | 23 |
| Resolution (μm) | 15 | 7 |
| | positive-type | negative-type |
| | ○ | ◎ |
| Adhesiveness | Δ | ◎ |

Resolution, Adhesiveness:
◎ very good
○ good
Δ little bad
PC-5: 1,2-naphthoquinone-2-diazide-5-sulfonic acid p-cresol ester (positive-type photosensitive material)

TABLE 7

Experimental Conditions and Experimental Results of Polyimide Resists

| Resist Item | Comparative Example 5 | Example 13-1 | Comparative Example 6 |
|---|---|---|---|
| Polyimide Content | 3 g | 3 g | 3 g |
| Radical Initiator | — | BAC-M | — |
| Added Amount | — | 0.6 g | — |
| Additive | PC-5 | — | PC-5 |
| Added Amount | 0.6 g | — | 0.6 g |
| Prebaking | 90° C. 10 min. | 90° C. 10 min. | 90° C. 10 min. |
| Film Thickness (μm) | 25 | 33 | 27 |
| UV Dose (mj) | 300 | 1000 | 1000 |
| Developer | A0 | A0 | A0 |
| Developing Tempreture | 40° C. | 43° C. | 40° C. |
| Developing Time (min./sec.) | 4/00 | 7/51 | 4/00 |
| Postbaking Tempreture in Former Step | 90° C. | 90° C. | 90° C. |
| Time of Former Step | 1 hr. | 1 hr. | 1 hr. |
| Film Thickness (μm) | 20 | 13 | 23 |
| Resolution (μm) | 15 | 15 | 15 |
| | positive-type | negative-type | positive-type |
| | ◎ | ◎ | ◎ |
| Adhesiveness | ○ | ◎ | ◎ |

Resolution, Adhesiveness:
◎ very good
○ good
Δ little bad

Example 15

The operations similar to Example 1 were repeated.

32.23 g (100 mmol) of BTDA, 6.11 g (50 mmol) of 2,4-diaminotoluene, 1.5 g (15 mmol) of γ-valerolactone, 2.4 g (30 mmol) of pyridine, 218 g of NMP and 30 g of toluene were fed. The mixture was stirred at 180° C. at 180 rpm for 1 hour. During the reaction, toluene-water azeotrope was removed.

After cooling the mixture to room temperature, 14.71 g (50 mmol) of BPDA, 7.61 g (20 mmol) of 2,4-diaminobenzoic acid, 21.63 g (50 mmol) of bis{4-(3-aminophenoxy)phenyl}sulfone, 218 g of NMP and 30 g of toluene were added.

Under nitrogen atmosphere, the mixture was stirred at room temperature for 0.5 hour, and the mixture was heated to 180° C., followed by stirring the mixture at 180 rpm for 1 hour. The mixture was then stirred at 180° C. at 100 rpm for 4 hours. During the reaction, toluene-water azeotrope was removed.

The polymer concentration of the thus obtained polyimide solution was 20% by weight. The molecular weight of this polyimide was measured as in Example 1. The molecular weights in terms of polystyrene were: Number Average Molecular Weight (Mn): 30,900; Weight Average Molecular Weight (Mw): 93,800; Z Average Molecular Weight (Mz): 230,000; Mw/Mn=3.04; Mz/Mn=7.45.

Example 16

The operations similar to Example 1 were repeated.

29.79 g (120 mmol) of BCD, 9.13 g (60 mmol) of 2,4-diaminobenzoic acid, 2.4 g (24 mmol) of γ-valerolactone, 3.84 g (48 mmol) of pyridine, 215 g of NMP and 30 g of toluene were fed. The mixture was stirred at 180° C. at 180 rpm for 1 hour. During the reaction, toluene-water azeotrope was removed.

After cooling the mixture to room temperature, 35.31 g (120 mmol) of BPDA, 17.54 g (60 mmol) of 1,3-(3-aminophenoxy)benzene, 24.02 g (120 mmol) of 3,4'-diaminodiphenyl ether, 214 g of NMP and 30 g of toluene were added.

Under nitrogen atmosphere, the mixture was stirred at room temperature for 0.5 hour, and the mixture was heated to 180° C., followed by stirring the mixture at 180 rpm for 3 hours. The mixture was then stirred at 180° C. at 100 rpm for 50 minutes. During the reaction, toluene-water azeotrope was removed.

The polymer concentration of the thus obtained polyimide solution was 20% by weight. The molecular weight of this polyimide was measured as in Example 1. The molecular weights in terms of polystyrene were: Number Average Molecular Weight (Mn): 34,000; Weight Average Molecular Weight (Mw): 63,200; Z Average Molecular Weight (Mz): 104,000; Mw/Mn=1.86; Mz/Mn=3.05.

Example 17

The operations similar to Example 1 were repeated.

12.89 g (40 mmol) of BTDA, 8.65 g (20 mmol) of bis{4-(3-aminophenoxy)phenyl}sulfone, 6.11 g (50 mmol) of 2,4-diaminotoluene, 0.8 g (8 mmol) of γ-valerolactone, 1.3 g (16 mmol) of pyridine, 195 g of NMP and 30 g of toluene were fed. The mixture was stirred at 180° C. at 180 rpm for 1 hour. During the reaction, toluene-water azeotrope was removed.

After cooling the mixture to room temperature, 11.77 g (40 mmol) of BPDA, 3.04 g (20 mmol) of 2,4-diaminobenzoic acid, 5.85 g (20 mmol) of bis-1,4-(3-aminophenoxy)-benzene, 4.00 g (20 mmol) of 3,4'-diaminodiphenyl ether, 195 g of NMP and 20 g of toluene were added.

Under nitrogen atmosphere, the mixture was stirred at room temperature for 0.5 hour, and the mixture was heated to 180° C., followed by stirring the mixture at 180 rpm for 2 hours and 45 minutes. During the reaction, toluene-water azeotrope was removed. After the reaction, 41 g of NMP was added.

The polymer concentration of the thus obtained polyimide solution was 10% by weight. The molecular weight of this polyimide was measured as in Example 1. The molecular weights in terms of polystyrene were: Number Average Molecular Weight (Mn): 25,900; Weight Average Molecular Weight (Mw): 72,300; Z Average Molecular Weight (Mz): 160,400; Mw/Mn=2.79; Mz/Mn=6.19.

Example 18

The operations similar to Example 1 were repeated.

44.43 g (100 mmol) of 4,4'-{2,2,2-trifluoro-1-(trifluoromethyl)ethylidene}bis1,2-benzenedicarboxylic dianhydride, 36.63 g (100 mmol) of(3-amino-4-hydroxyphenyl)hexafluoropropane, 1.0 g (10 mmol) of γ-valerolactone, 1.6 g (20 mmol) of pyridine, 312 g of NMP and 50 g of toluene are fed. After stirring the mixture under nitrogen atmosphere at room temperature for 0.5 hours, the mixture was heated to 180° C. and stirred at 180 rpm for 6 hours and 10 minutes. During the reaction, toluene-water azeotrope was removed.

The polymer concentration of the thus obtained polyimide solution was 20% by weight. The molecular weight of this polyimide was measured as in Example 1. The molecular weights in terms of polystyrene were: Number Average Molecular Weight (Mn): 56,800; Weight Average Molecular Weight (Mw): 170,000; Z Average Molecular Weight (Mz): 307,000; Mw/Mn=2.99; Mz/Mn=5.40.

Example 19

The operations similar to Example 1 were repeated.

44.43 g (100 mmol) of 4,4'-{2,2,2-trifluoro-1-(trifluoromethyl)ethylidene}bis1,2-benzenedicarboxylic dianhydride, 18.31 g (50 mmol) of (3-amino-4-hydroxyphenyl)hexafluoropropane, 10.01 g (50 mmol) of 4,4-diaminodiphenyl ether, 1.0 g (10 mmol) of γ-valerolactone, 1.6 g (20 mmol) of pyridine, 277 g of NMP and 50 g of toluene are fed. After stirring the mixture under nitrogen atmosphere at room temperature for 0.5 hour, the mixture was heated to 180° C. and stirred at 180 rpm for 3 hours and 25 minutes. During the reaction, toluene-water azeotrope was removed.

The polymer concentration of the thus obtained polyimide solution was 20% by weight. The molecular weight of this polyimide was measured as in Example 1. The molecular weights in terms of polystyrene were: Number Average Molecular Weight (Mn): 28,300; Weight Average Molecular Weight (Mw): 77,500; Z Average Molecular Weight (Mz): 137,700; Mw/Mn=2.74; Mz/Mn=4.86.

Example 20

Preparation of Photosensitive Compositions and Formation of Pattern by Selective Exposure In the same manner as in Example 2, photosensitive compositions were prepared and images were formed therefrom.

The conditions and the results of the above-described experiments are summarized in Tables 8, 9, 10 and 11.

TABLE 8

Experimental Conditions and Experimental Results of Polyimide Resists

| Resist Item | Example 15-1 | Comparative Example 7 | Example 16-1 | Example 16-2 |
|---|---|---|---|---|
| Polyimide Content | 3 g | 3 g | 3 g | 3 g |
| Radical Initiator | BAC-M | — | BAC-M | BAC-M |
| Added Amount | 0.6 g | — | 0.6 g | 0.6 g |
| Additive | — | PC-5 | — | Styrene |
| Added Amount | — | 0.6 g | — | 0.9 g |
| Prebaking | 90° C. 10 min. | 90° C. 10 min. | 90° C. 10 min. | 90° C. 10 min. |
| Film Thickness (μm) | 12 | 17 | 10 | 10 |
| UV Dose (mj) | 700 | 330 | 660 | 1000 |
| Developer | A0 | A0 | A0 | A0 |
| Developing Tempreture | 43° C. | 40° C. | 40° C. | 41° C. |
| Developing Time (min./sec.) | 3/00 | 2/00 | 4/00 | 6/00 |
| Postbaking | | | | |

TABLE 8-continued

Experimental Conditions and Experimental Results of Polyimide Resists

| Item | Example 15-1 | Comparative Example 7 | Example 16-1 | Example 16-2 |
|---|---|---|---|---|
| Tempreture in Former Step | 90° C. | 90° C. | 90° C. | 90° C. |
| Time of Former Step | 1 hr. | 1 hr. | 1 hr. | 2 hr. |
| Tempreture in Latter Step | 150° C. | 150° C. | 180° C. | — |
| Time of Latter Step | 30 min. | 30 min. | 30 min. | — |
| Film Thickness (μm) | 7 | 14 | 3 | 6 |
| Resolution (μm) | 15 | 15 | 15 | 15 |
|  | negative-type ◯ | positive-type ⊚ | negative-type ◯ | negative-type ⊚ |
| Adhesiveness | ◯ | ⊚ | Δ | ◯ |

Resolution, Adhesiveness:
⊚ very good
◯ good
Δ little bad

TABLE 9

Experimental Conditions and Experimental Results of Polyimide Resists

| Item | Comparative Example 8 | Example 17-1 | Example 17-2 | Example 17-3 |
|---|---|---|---|---|
| Polyimide Content | 3 g | 3 g | 3 g | 3 g |
| Radical Initiator | — | BAC-M | BAC-M | BAC-M |
| Added Amount | — | 0.6 g | 0.6 g | 0.6 g |
| Additive | PC-5 | — | EGA | Styrene |
| Added Amount | 0.6 g | — | 0.9 g | 0.9 g |
| Prebaking | 90° C. 10 min. | 90° C. 10 min. | 90° C. 10 min. | 90° C. 10 min. |
| Film Thickness (μm) | 10 | 10 | 8 | 8 |
| UV Dose (mj) | 600 | 600 | 330 | 330 |
| Developer | A0 | A0 | A0 | A0 |
| Developing Tempreture | 41° C. | 41° C. | 41° C. | 42° C. |
| Developing Time (min./sec.) | 4/00 | 5/10 | 2/35 | 3/30 |
| Postbaking |  |  |  |  |
| Tempreture in Former Step | 90° C. | 90° C. | 90° C. | 90° C. |
| Time of Former Step | 1 hr.. | 30 min. | 2 hr.. | 2 hr.. |
| Tempreture in Latter Step | — | 180° C. | — | — |
| Time of Latter Step | — | 30 min. | — | — |
| Film Thickness (μm) | 7 | 4 | 2 | 2 |
| Resolution (μm) | 15 | 15 | 15 | 15 |
|  | positive-type ⊚ | negative-type ⊚ | negative-type ◯ | negative-type ◯ |
| Adhesiveness | ⊚ | ⊚ | ◯ | ◯ |

Resolution, Adhesiveness:
⊚ very good
◯ good
Δ little bad

TABLE 10

Experimental Conditions and Experimental Results of Polyimide Resists

| Item | Comparative Example 9 | Example 18-1 | Example 18-2 | Example 18-3 |
|---|---|---|---|---|
| Polyimide Content | 3 g | 3 g | 3 g | 3 g |
| Radical Initiator | — | BAC-M | BAC-M | BAC-M |
| Additive | NT-200 | — | EGA | Styrene |
| Added Amount | 0.6 g | — | 0.9 g | 0.9 g |
| Prebaking | 90° C. 10 min. | 90° C. 10 min. | 90° C. 10 min. | 90° C. 10 min. |
| Film Thickness (μm) | 3 | 4 | 8 | 8 |
| UV Dose (mj) | 330 | 600 | 330 | 1000 |
| Developer | A0 | TMAH5% | TMAH5% | TMAH5% |
| Developing Tempreture | 40° C. | 30° C. | 37° C. | 28° C. |
| Developing Time (min./sec.) | 1/15 | 0/30 | 0/70 | 1/55 |
| Postbaking |  |  |  |  |

TABLE 10-continued

Experimental Conditions and Experimental Results of Polyimide Resists

| Resist Item | Comparative Example 9 | Example 18-1 | Example 18-2 | Example 18-3 |
|---|---|---|---|---|
| Tempreture in Former Step | 90° C. | 90° C. | 90° C. | 90° C. |
| Time of Former Step | 30 min. | 30 min. | 2 hr.. | 3 min. |
| Tempreture in Latter Step | 150° C. | 150° C. | — | 180° C. |
| Time of Latter Step | 30 min. | 30 min. | — | 3 hr. |
| Film Thickness (μm) | 2 | 1 | 2 | 3 |
| Resolution (μm) | 15 positive-type ⊚ | 15 negative-type ○ | 25 negative-type Δ | 15 negative-type ○ |
| Adhesiveness | ⊚ | Δ | Δ | ○ |

Resolution, Adhesiveness:
⊚ very good
○ good
Δ little bad
TMAH5%: 5% aqueous tetramethylammonium hydroxide solution

TABLE 11

Experimental Conditions and Experimental Results of Polyimide Resists

| Resist Item | Comparative Example 10 | Example 19-1 | Comparative Example 11 |
|---|---|---|---|
| Polyimide Content | 3 g | 3 g | 3 g |
| Radical Initiator | — | BAC-M | — |
| Added Amount | — | 0.6 g | — |
| Additive | PC-5 | — | PC-5 |
| Added Amount | 0.6 g | — | 0.6 g |
| Prebaking | 90° C. 10 min. | 90° C. 10 min. | 90° C. 10 min. |
| Film Thickness (μm) | 8 | 10 | 9 |
| UV Dose (mj) | 330 | 330 | 330 |
| Developer | TMAH5% | TMAH5% | TMAH5% |
| Developing Tempreture | 33° C. | 40° C. | 35° C. |
| Developing Time (min./sec.) | 0/50 | 14/15 | 8/01 |
| Postbaking Temperature in Former Step | 90° C. | 90° C. | 90° C. |
| Time of Former Step | 30 min. | 30 min. | 30 min. |
| Tempreture in Latter Step | 180° C. | 180° C. | 180° C. |
| Time of Latter Step | 30 min. | 30 min. | 30 min. |
| Film Thickness (μm) | 10 | 3 | 6 |
| Resolution(μm) | 4 positive-type ⊚ | 20 negative-type Δ | 15 positive-type ⊚ |
| Adhesiveness | ⊚ | Δ | ⊚ |

Resolution, Adhesiveness:
⊚ very good
○ good
Δ little bad

INDUSTRIAL AVAILABILITY

According to the present invention, negative-type images can be formed by adding a radical initiator to the polyimide solution composition and by irradiating the composition through a pattern. In this case, the negative-type images can also be formed by adding an olefin compound and a radical initiator to the polyimide solution composition. By making the polyimide molecules to be multi-component by employing the block copolymerization method using an acid catalyst, characteristics such as adhesiveness, heat resistance and low dielectric constant may be given in addition to the high resolution. The negative-type photosensitive polyimide copolymer according to the present invention may be widely used in the field of production of semiconductors, electronic parts and so on.

The invention claimed is:

1. A negative-type photosensitive polyimide composition comprising a photo radical initiator which generates free radical upon being irradiated with light or electron beam and a solvent-soluble polyimide which shows negative-type photosensitivity in the presence of said photo radical initiator, and wherein said solvent-soluble polyimide consists essentially of at least one aromatic diamine component selected from the group consisting of 4,4'-diaminodiphenyl ether, 3,4'-diaminodiphenyl ether, bis(4-phenoxy) 1,4-benzene, bis(3-phenoxy)1,4-benzene, bis(3-phenoxy) 1,3-benzene, 2,2-bis(4- aminophenyl) propane, 1,1,1,3,3,3-hexafluoro-2-bis(4-aminophenyl) propane, 4,4'-diaminodiphenylmethane, bis(4-aminophenoxy)4,4'-diphenyl, 2,2-bis {(4-aminophenoxy)phenyl}pronane, 2,2-bis {(4-aminophenoxy)phenyl }hexafluoropropane, 1,3-diaminobenzene, 1,4-diaminobenzene, 2,4-diaminotoluene, 3,3'-dimethyl-4,4'-diaminobiphenyl, 2,2'-bis(trifluoromethyl)benzidine, bis(4-aminophenoxy)-1,3-(2,2-dimethyl)propane and diaminosiloxane; and at least one aromatic acid component selected from the group consisting of 3,4,3',4'-benzophenonetetracarboxylic dianhydride, 3,4,3',4'-biphenyltetracarboxylic dianhydride, pyromellitic dianhydride, 2,3,3',4'-biphenyl ether tetracarboxylic dianhydride, 1,2,5,6-naphthalenetetracarboxylic dianhydride, 2,3,5,6-pyridinetetracarboxylic dianhydride, 3,4,3',4'-biphenylsulfonetetracarboxylic dianhydride, bicyclo(2, 2,2)-oct-7-ene-2,3,5,6-tetracarboxylic dianhydride, 4,4'- {(2 and 2,2-trifluoro- 1-(trifluoromethyl) ethylidenel}bis( 1,2-benzenedicarboxylic dianhydride).

2. The composition according to claim 1, wherein said polyimide is one generated by polycondensation between (an) acid dianhydride(s) and (an) aromatic diamine(s) in the presence of an acid catalyst in an organic polar solvent, and which composition contains said organic polar solvent as its solvent.

3. The composition according to claim 2, wherein said acid catalyst consists essentially of a lactone and a base, and said polyimide is obtained by removing water generated in the reaction by azeotropic distillation with toluene or xylene.

4. The composition according to claim 2, wherein said organic polar solvent is at least one selected from the group consisting of N-methylpyrrolidone, N,N -dimethylformamide, N,N-dimethylacetamide, sulfolane and tetramethylurea, and said polyimide is dissolved in said solvent at a concentration of not less than 5% by weight.

5. The composition according to any one of claims 1 to 4, wherein said polyimide is a polyimide block copolymer having a ratio of total diamines to total tetracarboxylic dianhydrides of 1.05 to 0.95, which copolymer is prepared by polycondensation process wherein a polyimide oligomer is first prepared by using either one of a tetracarboxylic dianhydride or a diamine in excess, then a tetracarboxylic dianhydride and/or diamine is(are) added, and the mixture is heated to carry out dehydration.

6. The composition according to claim 5, wherein said polyimide block copolymer has a weight average molecular weight in terms of polystyrene of 30,000 to 400,000.

7. The composition according to claim 1, wherein said photo radical initiator is at least one selected from the group consisting of 4,4'-diazidestilbene, 2,6-di (4-azidebenzilidene)-4-methoxycyclohexane and 4,4'-diazide-3,3'-dimethoxydiphenyl.

8. The composition according to claim 1, said composition further comprising an olefin compound.

9. The composition according to claim 8, wherein said olefin compound is at least one selected from the group consisting of (meth)acrylic acid, (meth)acrylic acid esters, (meth)acrylic acid amide and styrene.

10. method for forming a negative-type image made of polyimide, comprising coating a substrate with said composition according to claim 1; heating said composition to 70 to 100° C. and making said composition into the form of a film; irradiating said film with a light through a pattern mask; and immersing the resulting film in an alkali solution to develop said film.

11. The method according to claim 10, further comprising washing the obtained negative-type image with water, and heating the resulting image at a temperature not higher than 250° C. so as to convert said image to a polyimide insulation film constituting said negative-type image.

12. The method according to claim 10 or 11, wherein said alkali developer contains ethanolamine and/or a derivative thereof.

13. The method according to claim 10 or 11, wherein said alkali developer is aqueous solution of tetramethylammonium hydroxide and/or sodium hydroxide.

14. The composition according to claim 1, wherein said polyimide further comprises at least one aromatic diamine component selected from the group consisting of 3,3'-dimethyl-4,4'-diamino-biphenylsulfone, 3,3'-dimethoxy-4,4'-diamino -biphenylsulfone, 4,4'-diaminodiphenyl sulfide, 4,4'-diaminodiphenyl disulfide, 9,9-bis(4-aminophenyl)fluorene, 1,4-diamino-2-nitrobenzene, 1,5-diamino-2-nitrobenzene, 3-nitro-4,4'-diaminobiphenyl, 3,3-dinitro-4,4'-diaminobiphenyl, 2,4-diaminoacetophenone, 2,4-diaminobenzophenone, 2-amino-4'-aminobenzophenone, 2-amino-5-aminofluorene, 3,3'-diaminodiphenylsulfone, 4,4-diaminodiphenylsulfone, bis-{4-(3-aminophenoxy) biphenyl}sulfone, bis-{4-(4-aminophenoxy) biphenyl}sulfone, bis {4-(4-aminophenoxy )phenyl}sulfone, bis{4-(3-aminophenoxy)phenyl}sulfone, o-tolidine sulfone, 4,4'-diaminobenzophenone, 3,3 '-diaminobenzophenone, 2-nitro- 1,4-diaminobenzene, 3,3 '-dinitro -4,4-diaminobiphenyl, 3,3'-dimethoxy-4,4'-diaminobiphenyl and 1,5-diaminonaphthalene.

15. The composition according to claim 1, wherein said polyimide further comprises at least one aromatic diamine component selected from the group consisting of 2,6-diaminopyridine, 3,5-diaminopyridine, 3,5-diamino-2,4-dimethylpyridine, 1,4-diamino-2-hydroxybenzene, 3,3'-dihydroxy-4,4'-diaminobiphenyl and 3,3 '-dimethoxy-4,4'-diaminobiphenyl, bis(3-amino-4-hydroxyphenyl) hexafluoropropane, 3,5-diaminobenzoic acid and 2-hydroxy-1,4-diaminobenzene.

16. The composition according to claim 14, wherein said polyimide further comprises at least one aromatic diamine component selected from the group consisting of 2,6-diaminopyridine, 3,5-diaminopyridine, 3,5-diamino-2,4-dimethylpyridine, 1,4-diamino-2-hydroxybenzene, 3,3'- dihydroxy-4,4'-diaminobiphenyl and 3,3 '-dimethoxy-4,4'-diaminobiphenyl, bis(3 -amino-4-hydroxyphenyl) hexafluoropropane, 3,5 -diaminobenzoic acid and 2-hydroxy- 1,4-diaminobenzene.

* * * * *